(12) United States Patent
Ahn et al.

(10) Patent No.: US 7,387,955 B2
(45) Date of Patent: Jun. 17, 2008

(54) FIELD EFFECT TRANSISTOR AND METHOD FOR MANUFACTURING THE SAME

(75) Inventors: Ho Kyun Ahn, Daejeon (KR); Jong Won Lim, Daejeon (KR); Jae Kyoung Mun, Daejeon (KR); Hong Gu Ji, Daejeon (KR); Woo Jin Chang, Daejeon (KR); Hea Cheon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 118 days.

(21) Appl. No.: 11/454,721

(22) Filed: Jun. 16, 2006

(65) Prior Publication Data

US 2007/0099368 A1 May 3, 2007

(30) Foreign Application Priority Data

Nov. 3, 2005 (KR) ...................... 10-2005-0104958

(51) Int. Cl.
*H01L 21/44* (2006.01)

(52) U.S. Cl. ...................... 438/574; 438/182; 438/579; 438/701; 438/708; 257/E21.205; 257/E21.233; 257/E21.624

(58) Field of Classification Search ................ 438/182, 438/573, 574, 578, 579; 257/E21.233, E21.624, 257/E21.638
See application file for complete search history.

(56) References Cited

U.S. PATENT DOCUMENTS

| 6,812,111 B2 * | 11/2004 | Cheong et al. ............. 438/396 |
| 7,238,560 B2 * | 7/2007 | Sheppard et al. ........... 438/172 |
| 2003/0162406 A1 * | 8/2003 | Gehoski et al. ............. 438/725 |

FOREIGN PATENT DOCUMENTS

| JP | 3226806 | 6/1998 |
| KR | 100276077 | 12/1999 |
| KR | 100331018 | 8/2001 |

* cited by examiner

*Primary Examiner*—Michael S. Lebentritt
*Assistant Examiner*—Cheung Lee
(74) *Attorney, Agent, or Firm*—Ladas and Parry LLP

(57) ABSTRACT

A field effect transistor having a T- or Γ-shaped fine gate electrode of which a head portion is wider than a foot portion, and a method for manufacturing the field effect transistor, are provided. A void is formed between the head portion of the gate electrode and a semiconductor substrate using an insulating layer having a multi-layer structure with different etch rates. Since parasitic capacitance between the gate electrode and the semiconductor substrate is reduced by the void, the head portion of the gate electrode can be made large so that gate resistance can be reduced. In addition, since the height of the gate electrode can be adjusted by adjusting the thickness of the insulating layer, device performance as well as process uniformity and repeatability can be improved.

5 Claims, 5 Drawing Sheets

FIELD EFFECT TRANSISTOR AND METHOD FOR MANUFACTURING THE SAME

CROSS-REFERENCE TO RELATED APPLICATION

This application claims priority to and the benefit of Korean Patent Application No. 2005-104958, filed on Nov. 3, 2005, the disclosure of which is incorporated herein by reference in its entirety.

BACKGROUND

1. Field of the Invention

The present invention relates to a field effect transistor and a method for manufacturing the same, and more particularly, to a field effect transistor having a T- or Γ-shaped fine gate electrode of which a head portion is wider than a foot portion and a method for manufacturing the same.

2. Discussion of Related Art

With the increasing integration density of semiconductor devices came the reduction in gate length of transistors, and as a cross-sectional area decreases due to the reduction of the gate length, a problem of increase in gate resistance has emerged. Particularly, the characteristics of a GaAs high electron mobility transistor (HEMT), frequently used in communication devices and high-speed computers due to an excellent low-noise characteristic and high operating speed, can be controlled to a large extent by the resistance value of the gate. Therefore, various methods such as a stable low-resistance ohmic process, ultra-fine low-resistance T- or Γ-shaped gate formation, and so forth have been proposed to reduce the resistance value of the gate.

FIGS. 1a to 1f are cross-sectional views illustrating a method for manufacturing a conventional field effect transistor having a T-shaped gate electrode.

Referring to FIG. 1a, an active layer 11 and a cap layer 12 providing source and drain areas and a channel area are formed on a semiconductor substrate 10 in order.

Referring to FIG. 1b, an ohmic metal layer 13 is formed on the cap layer 12 of the source and drain areas.

Referring to FIG. 1c, a multi-layer structure, e.g., photoresist layers 14, 15 and 16 having a triple-layer structure, are formed on the entire surface, and then the photoresist layers 16, 15 and 14 are patterned to form a hole structure shaped like a T-shaped gate electrode. Here, in order to minimize the length of the foot of a gate electrode, the photoresist layer 14 providing an opening for the foot of the gate electrode is generally formed to be thin.

Referring to FIG. 1d, an exposed portion of the cap layer 12 is removed by an etching process that uses the patterned photoresist layers 14, 15 and 16 as a mask. Here, in order to prevent the foot of the gate electrode to be formed from contacting the cap layer 12, the cap layer 12 is etched wider than the exposed portion defined by the photoresist layer 14 so that a recess structure 17 is formed under the photoresist layer 14.

Referring to FIG. 1e, after metal is deposited over the entire surface of the substrate having the recess structure 17, the photoresist layers 16, 15 and 14 are removed by a lift off process to form a T-shaped gate electrode 18.

Referring to FIG. 1f, an insulating layer such as a silicon nitride layer, a silicon oxide layer, etc. is deposited over the entire surface of the substrate having the gate electrode 18 to form a protection layer 19.

As described above, conventionally, a gate electrode is formed in a T or Γ shape using a photoresist layer having a multi-layer structure. In addition, the lower photoresist layer for forming the foot of the gate electrode is formed to be thin, so that the gate electrode is formed to have a small height. However, according to this method, as distance between the head of the gate electrode and the semiconductor substrate decreases, parasitic capacitance increases. And, as the width of the head of the gate electrode is increased in order to reduce the resistance of the gate electrode, the parasitic capacitance increases all the more.

In addition, according to the conventional method described above, since the protection layer is filled in the recess structure when the protection layer is formed, parasitic capacitance between the head of the gate electrode and the semiconductor substrate increases even more. In order to prevent this, the protection layer should be thinly deposited. However, when the protection layer is thinly deposited, it may not provide sufficient protection, which results in deterioration of the characteristics and reliability of the device.

SUMMARY OF THE INVENTION

The present invention is directed to a field effect transistor having a void formed between the head of a gate electrode and a semiconductor substrate using an insulating layer having a multi-layer structure with different etch rates, and a method for manufacturing the same.

One aspect of the present invention provides a field effect transistor comprising: an active layer providing a source area, a drain area, and a channel area; a gate electrode formed on the active layer of the channel area and having a head portion formed to be wider than a foot portion; a cap layer formed on the active layer at a distance from both sides of the gate electrode; and an insulating layer formed between the head portion of the gate electrode and the cap layer and having a void formed therein corresponding to the head portion of the gate electrode.

Another aspect of the present invention provides a method for manufacturing a field effect transistor, the method comprising the steps of: forming a cap layer on a semiconductor substrate on which an active layer is formed; forming insulating layers having a multi-layer structure on the cap layer; forming a photoresist layer pattern for forming a gate electrode of which a head portion is wider than a foot portion on the insulating layer; etching a portion of the insulating layer having the multi-layer structure using the photoresist layer pattern as a mask; forming a void in the insulating layer having the multi-layer structure corresponding to the head portion of the gate electrode; etching the cap layer using the photoresist layer pattern as a mask; and depositing a conductive material over the entire surface of the substrate and then removing the photoresist layer pattern to form the gate electrode on the active layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Figure 1A:
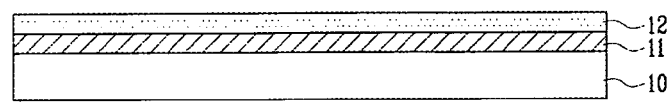
FIGS. 1a to 1f are cross-sectional views illustrating a method for manufacturing a conventional field effect transistor.
Figure 1B:
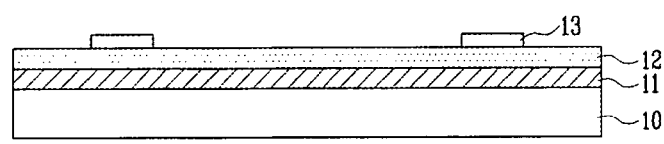
Figure 1C:
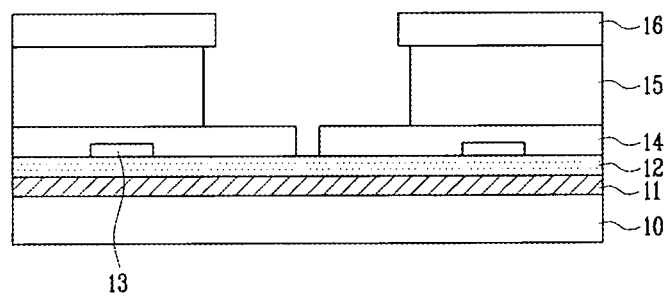
Figure 1D:
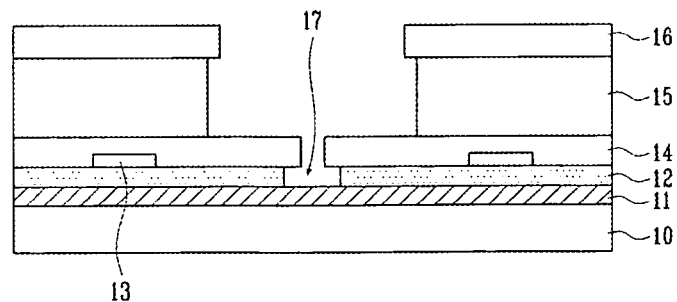
Figure 1E:
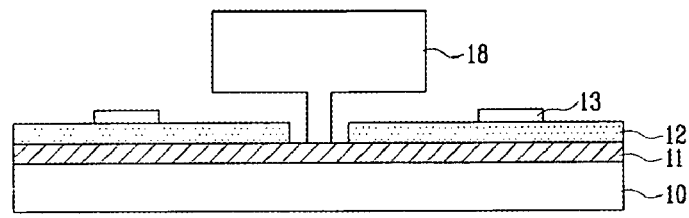
Figure 1F:
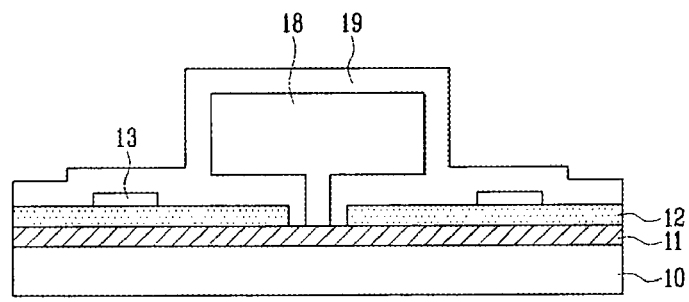

Hereinafter, exemplary embodiments of the present invention will be described in detail. However, the present invention is not limited to the embodiments disclosed below, but can be implemented in various modified forms. Therefore, the embodiments below are provided for complete disclosure of the present invention and to fully inform the scope of the present invention to those of ordinary skill in the art. In the following description, when it is described that a first layer is on a second layer, the first layer may be directly on the second layer, or there may be a third layer between the first and second layers. Throughout the drawings, the thickness or size of layers may be exaggerated for clarity, and like elements are denoted by like reference numerals.

FIGS. 2a to 2j are cross-sectional views illustrating a method for manufacturing a field effect transistor according to an exemplary embodiment of the present invention.

Figure 2A:
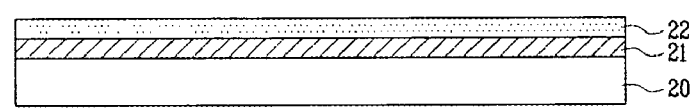
FIGS. 2a to 2j are cross-sectional views illustrating a method for manufacturing a field effect transistor according to an exemplary embodiment of the present invention.

Referring to FIG. 2a, an active layer 21 and a cap layer 22 providing source, drain and channel areas are formed on a compound semiconductor substrate 20 made of semi-insulating GaAs, etc.

Figure 2B:
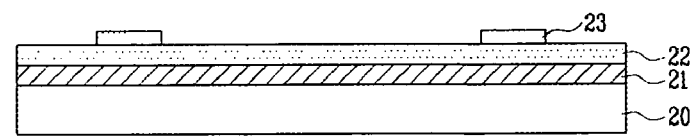

Referring to FIG. 2b, an ohmic metal layer 23 is formed on the cap layer 22 of the source and drain areas. A photoresist layer pattern (not shown in the drawings) exposing the source and drain areas is formed on the cap layer 22, metal is deposited on the cap layer 22, and rapid thermal annealing (RTA) is performed to form the ohmic metal layer 23. For example, in the case of a high electron mobility transistor (HEMT), metal semiconductor field effect transistor (MESFET), and so forth using a compound semiconductor, AuGe, Ni, Au, etc. are deposited in order to form the ohmic metal layer 23.

Figure 2C:
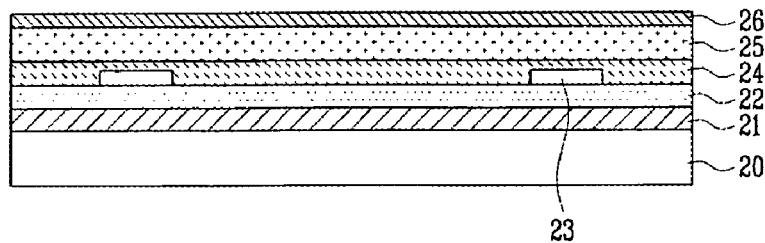

Referring to FIG. 2c, insulating layers 24, 25 and 26 having a multi-layer structure, e.g., a three-layer structure, are formed on the entire surface of the substrate including the ohmic metal layer 23. Here, in the insulating layers having the multi-layer structure, the middle layer in which a void will be formed should have a higher etch rate than the other layers. Therefore, the first and third insulating layers 24 and 26 should have lower etch rates than the second insulating layer 25. The first to third insulating layers 24, 25 and 26 are preferably formed of a material that can protect the surface of the semiconductor substrate 20, for example, a silicon nitride layer, a silicon oxide layer, or a silica thin layer having a low dielectric constant. In addition, the thicknesses of the first to third insulating layers 24, 25 and 26 are determined by considering the etch rates of photoresist layers disposed at the lowest part and the upper part among photoresist layers (not shown) that will be formed on the insulating layers 24, 25 and 26, a distance between the head portion of a T- or Γ-shaped gate electrode to be formed and the semiconductor substrate, and so forth.

Figure 2D:
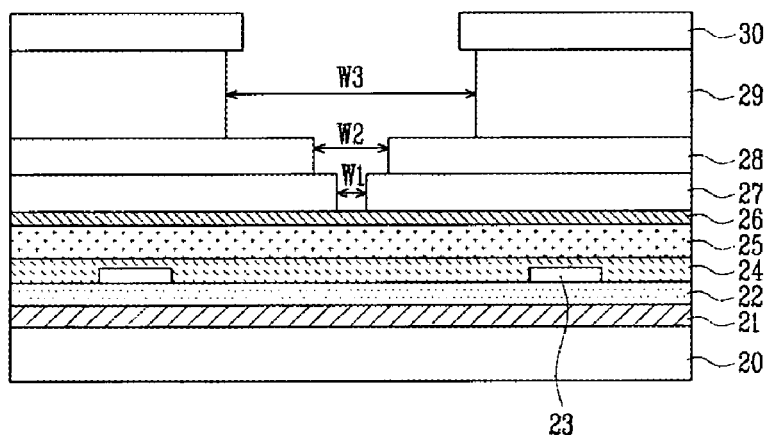

Referring to FIG. 2d, photoresist layers 27, 28, 29 and 30 having a multi-layer structure, e.g., a four-layer structure, are formed on the third insulating layer 26, and then the photoresist layers 27, 28, 29 and 30 are patterned by a photolithography process, an electron beam lithography process, etc. to form an opening defining a T- or Γ-shaped gate electrode.

For example, when a T-shaped gate electrode having two steps is formed by the electron beam lithography process, a first opening w1 for the foot portion of a lower gate electrode is defined by the first photoresist layer 27, a second opening w2 for the head portion of the lower gate electrode is defined by the second photoresist layer 28, and a third opening w3 for the head portion of an upper gate electrode is defined by the third photoresist layer 29. The sizes of the openings w1, w2 and w3 are as follows: w1<w2<w3. The first to fourth photoresist layers 27, 28, 29 and 30 can be formed using various combinations such as polymethylmethacrylate (PMMA)/polymethylglutarimide (PMGI)/copolymer/PMMA, ZEP/PMGI/copolymer/ZEP, etc. Here, the composition of the first and second photoresist layers 27 and 28 should be decided by considering an etch selectivity so as not to damage the first and second photoresist layers 27 and 28 while the third insulating layer 26 is over-etched. In addition, the composition of the first and second photoresist layers 27 and 28 should be decided by considering an etch selectivity ratios so that when the first insulating layer 24 is etched, the head portion of the lower gate electrode is defined to have the size of the second opening w2 that is defined by the second photoresist layer 28, and the layers are etched to the size of the second opening w2 and down to the third insulating layer 26.

Figure 2E:
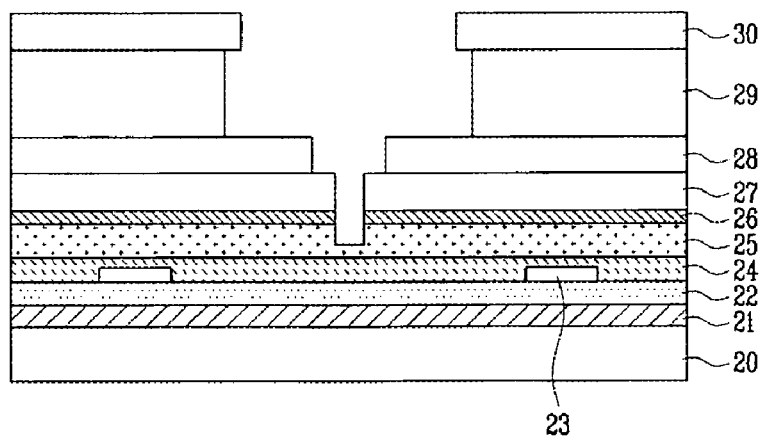

Referring to FIG. 2e, the exposed area of the third insulating layer 26 is removed by an etching process that uses the patterned first to fourth photoresist layers 27, 28, 29 and 30 as a mask. Here, the third insulating layer 26 is etched to the size of the first opening w1 defined by the first photoresist layer 27. Preferably the third insulating layer 26 is over-etched by an anisotropic etching process to expose the second insulating layer 25 so that the second insulating layer 25 is partially removed. When the second and third insulating layers 25 and 26 are formed of a silicon nitride layer, a silicon oxide alyer, etc., they can be etched by a method such as reactive ion etching (RIE) using $CF_4$ gas, etc., magnetically enhanced reactive ion etching (MERIE), inductively coupled plasma (ICP), and so forth.

Figure 2F:
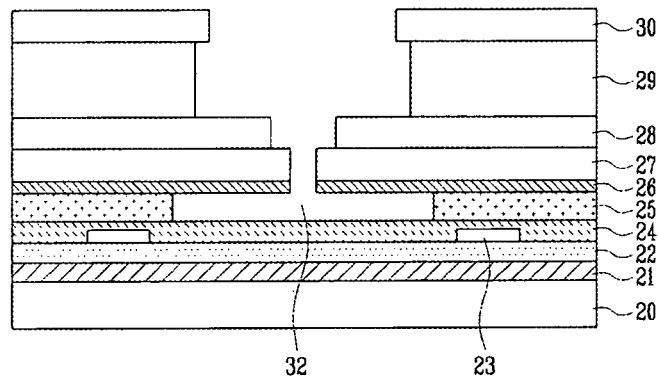

Referring to FIG. 2f, the second insulating layer 25 is etched by an isotropic etching process to form a void 32 under the third insulating layer 26. For example, when the exposed area of the second insulating layer 25 is etched by the isotropic etching process using the first photoresist layer 27 as a mask, the second insulating layer 25 is etched more due to etch rate differences between the second insulating layer 25 and the first and third insulating layers 24 and 26, so that the void 32 is formed between the first and third insulating layers 24 and 26. Here, in order to minimize parasitic capacitance between the head portion of the upper gate electrode and the semiconductor substrate, the void 32 is preferably formed to be larger than the third opening w3 for the head portion of the upper gate electrode.

Figure 2G:
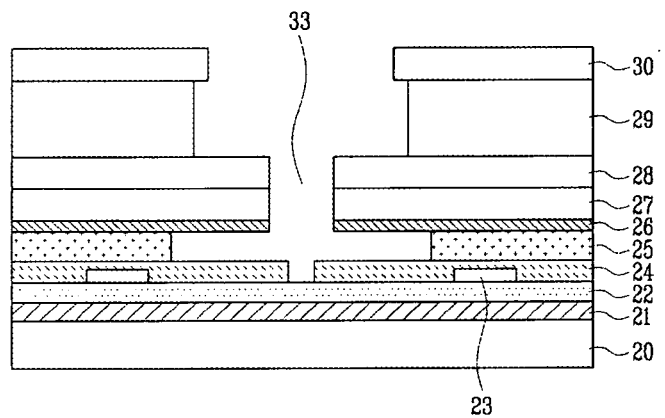

Referring to FIG. 2g, the first insulating layer 24 exposed through the void 32 is etched by an anisotropic etching process to the size of the first opening w1 defined by the first photoresist layer 27. Here, as the exposed portions of the first photoresist layer 27 and the third insulating layer 26 are sequentially etched, an opening 33 defined by the third insulating layer 26 attains the same size as that of the second opening w2 defined by the second photoresist layer 28.

Figure 2H:
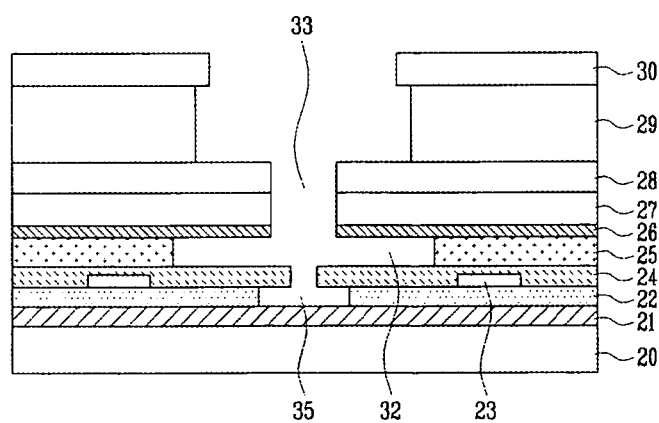

Referring to FIG. 2h, the cap layer 22 is etched isotropically or anisotropically to form a void 35 under the first insulating layer 24. Here, in order to minimize parasitic capacitance between the head portion of the lower gate electrode and the semiconductor substrate, the void 35 is preferably formed under the first insulating layer 24 by an isotropic etching process in which there is a large etch rate difference between the cap layer 22 and the active layer 21, and the void 35 is preferably formed to be larger than the second opening w2 for the head portion of the lower gate electrode. In addition, in the case of an HEMT, MESFET, and so forth using a compound semiconductor, the etching process for forming the void 35 may have a very important influence on the characteristics of the device. Therefore, it is preferable to control the etching process such that a proper size of the void 35 and a proper thickness of the active layer 21 are maintained while, for example, the amount of current flowing through the active layer 21 is measured.

For example, the cap layer 22 may be etched by a process having a single step or multiple steps of wet etching, dry etching, or combinations of wet and dry etching. Preferably, in order to remove plasma damage on the surface of the cap layer 22 caused while the first insulating layer 24 is etched, the etching process is performed in order of wet etching/dry etching/wet etching. The dry etching may employ electron cyclotron resonance (ECR) using a gas such as $BCl_3$, $SF_6$, etc., ICP, and so forth. The wet etching may use various etching solutions such as a phosphate solution in which $H_3PO_4$, $H_2O_2$, $H_2O$, etc. are mixed in a proper ratio.

Figure 2I:
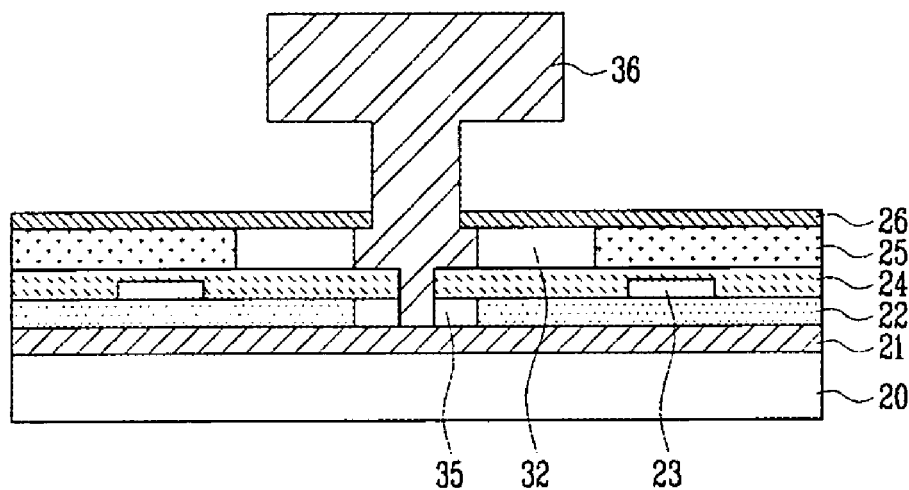

Referring to FIG. 2i, after metal is deposited over the entire surface of the substrate so that the voids 32 and 35 are partly filled up, the first to fourth photoresist layers 30, 29, 28 and 27 are removed by a lift off process to complete formation of a T-shaped gate electrode 36 having two steps on the active layer 21. For an HEMT, MESFET, and so forth using a compound semiconductor, Ti, Pt, Au, etc. are deposited in order so that the gate electrode 36 can be formed.

Figure 2J:
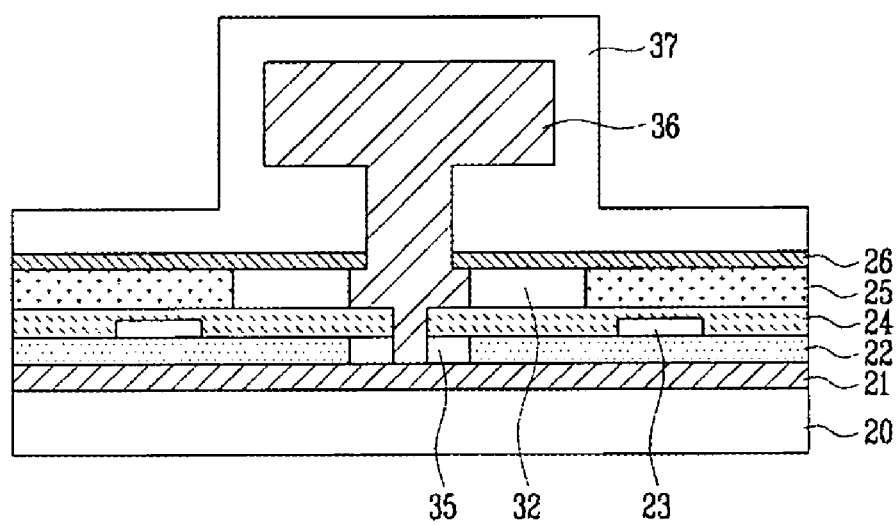

Referring to FIG. 2j, a silicon nitride layer or a silicon oxide layer is deposited over the entire surface of the substrate having the gate electrode 36 by a plasma enhanced chemical vapor deposition (PECVD) method to form a protection layer 37.

As illustrated in FIG. 2j, by the process set forth above, the field effect transistor of the present invention comprises the active layer 21, the gate electrode 36, the cap layer 22, and the insulating layers 24, 25 and 26. The active layer 21 provides the source, drain, and channel areas. The gate electrode 36 is formed on the active layer 21 of the channel area and has the head portions that are formed wider than the foot portions. The cap layer 22 is formed on the active layer 21 to be spaced apart from both sides of the gate electrode 36. The insulating layers 24, 25 and 26 are formed in the multi-layer structure in order to provide at least one void 32 between the head portion of the gate electrode 36 and the cap layer 22. The void 35 is formed between the gate electrode 36 and the cap layer 22 by the insulating layer 24.

As set forth above, according to the present invention, a void is formed between the head portion of a gate electrode and a semiconductor substrate using an insulating layer having a multiple-layer structure with different etch rates, in a manufacturing process of a field effect transistor having a fine T- or Γ-shaped gate electrode whose head portion is wider than its foot portion. Since parasitic capacitance between the head portion of the gate electrode and the semiconductor substrate is reduced by the void, the head portion of the gate electrode can be made large so that gate resistance can be reduced. In addition, since the height of the gate electrode can be adjusted by adjusting the thickness of the insulating layer, parasitic capacitance is reduced so that performance of the device is improved, and process uniformity and repeatability are also improved. In addition, since the void is formed to be sealed up by the insulating layer, a protection layer can be thickly deposited. Therefore, it is possible to manufacture, with uniformity and repeatability, a high-performance field effect transistor having excellent high-frequency and low-noise characteristics due to the low gate resistance and low parasitic capacitance.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method for manufacturing a field effect transistor, comprising the steps of:
   forming a cap layer on a semiconductor substrate on which an active layer is formed;
   forming insulating layers having a multi-layer structure on the cap layer;
   forming a photoresist layer pattern for forming a gate electrode of which a head portion is wider than a foot portion on the insulating layer;
   etching a portion of the insulating layer having the multi-layer structure using the photoresist layer pattern as a mask;
   forming a void in the insulating layer having the multi-layer structure corresponding to the head portion of the gate electrode;
   etching the cap layer using the photoresist layer pattern as a mask; and
   depositing a conductive material over the entire surface of the substrate and then removing the photoresist layer pattern to form the gate electrode on the active layer.

2. The method according to claim 1, wherein a middle layer in which the void is to be formed has a higher etch rate than other layers in the insulating layers having the multi-layer structure.

3. The method according to claim 2, wherein the void is formed by an isotropic etching process.

4. The method according to claim 1, wherein the void is formed wider than the head portion of the gate electrode.

5. The method according to claim 1, wherein the cap layer is etched wider than the insulating layer.

* * * * *